(12) United States Patent
Honda

(10) Patent No.: US 6,801,150 B2
(45) Date of Patent: Oct. 5, 2004

(54) A/D CONVERSION METHOD AND APPARATUS THEREFOR

(75) Inventor: Takayoshi Honda, Kariya (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 10/369,618

(22) Filed: Feb. 21, 2003

(65) Prior Publication Data

US 2003/0174082 A1 Sep. 18, 2003

(30) Foreign Application Priority Data

Mar. 12, 2002 (JP) ........................................ 2002-067161

(51) Int. Cl.[7] .............................................. H03M 1/38
(52) U.S. Cl. ...................................... 341/161; 341/155
(58) Field of Search ................................ 341/155, 161, 341/159

(56) References Cited

U.S. PATENT DOCUMENTS

| | | | |
|---|---|---|---|
| 5,396,247 A | 3/1995 | Watanabe et al. ........... | 341/157 |
| 5,834,636 A | 11/1998 | Sasaki et al. .............. | 73/117.3 |
| 6,452,518 B1 * | 9/2002 | Kawabata ................... | 341/118 |
| 6,683,552 B2 * | 1/2004 | Noll et al. .................. | 341/155 |

* cited by examiner

Primary Examiner—Peguy JeanPierre
(74) Attorney, Agent, or Firm—Nixon & Vanderhye P.C.

(57) ABSTRACT

An A/D conversion apparatus includes four A/D conversion units, each comprising ring delay lines, pulse selectors for detecting the positions reached by pulse signals in the ring delay lines, encoders for converting the reached positions that are detected into ma-bit digital values, mb-bit counters for counting the number of times the pulse signals have circulated through the ring delay lines, and latch circuits for latching the results counted by the counters. A control circuit sends digital values obtained from the A/D conversion units to a signal processing circuit which adds up together the digital values to calculate a digital value having the number of bits larger than that of the initial digital value.

12 Claims, 15 Drawing Sheets

A/D CONVERSION METHOD AND APPARATUS THEREFOR

CROSS REFERENCE TO RELATED APPLICATION

This application is based on and incorporates herein by reference Japanese Patent Application No. 2002-67161 filed on Mar. 12, 2002.

1. Field of the Invention

The present invention relates to an A/D conversion method of converting analog signals into digital signals, and to an apparatus therefor.

2. Background of the Invention

As an A/D conversion unit which is simple in construction and is capable of producing digital values of high resolution, has been disclosed in, for example, U.S. Pat. No. 5,834,636 (JP-A-5-259907). In this conversion unit, an analog signal to be subjected to the A/D conversion is fed as a power-source voltage to a delay line formed by connecting a plurality of delay elements of various gate circuits like a ring. A pulse signal to be transmitted is input thereto so as to circulate through the delay line at a speed corresponding to the delay times of the delay elements. The number of delay elements through which the pulse signal has passed in the delay line within a predetermined period of time is counted while the pulse signal is circulating, thereby to convert the analog signal into a digital value.

This A/D conversion unit utilizes a change in the delay times of the delay elements depending upon the power-source voltage. Upon supplying an analog signal as a power-source voltage to the delay elements that constitute the delay line, the moving speed of a pulse signal circulating through the delay line is modulated with the analog signal and is measured by counting the number of delay elements through which the pulse signal has passed within a predetermined period of time. The measured result (counted value) is output as a digital value after the A/D conversion.

According to this A/D conversion unit, the voltage resolution of the obtained digital value can be set depending upon the time of measuring the number of the delay elements through which the pulse signal has passed along the delay line. To enhance the voltage resolution of a digital value which is the result of A/D conversion, the time for the A/D conversion may be lengthened. It is therefore possible to provide an A/D conversion unit capable of realizing a highly precise A/D conversion in a simple construction and at a low cost.

However, the above A/D conversion unit is the integration type which makes it possible to enhance the voltage resolution of the obtained digital value with an increase in the A/D conversion time. Therefore, the digital value that is obtained is the one obtained by integrating the fluctuation components of the analog signals.

When the analog signal to be A/D-converted undergoes the fluctuation in the above A/D conversion unit, therefore, the amount of fluctuation could not be reflected in the obtained digital value. Therefore, the A/D conversion unit could not be used for the A/D conversion apparatus that requires high speed and high resolution like the A/D conversion apparatus disclosed in, for example, U.S. Pat. No. 5,396,247 (JP-A-9-21344).

That is, in order to obtain a digital value of high resolution, if the above integration-type A/D conversion unit is used for the above A/D conversion apparatus which subjects the signals from a knock sensor to the A/D conversion at every predetermined interval and subjects the signals from the air-flow sensor to the A/D conversion every time when the engine crankshaft turns by 10 degrees, then, it becomes no longer possible to normally execute the A/D conversion when the time used for the A/D conversion is shortened like when the engine is rotating at a high speed.

In the above integration-type A/D conversion unit, the time used for the A/D conversion may be shortened when it is attempted to execute the A/D conversion at high speeds. If the time is shortened, however, there arises a problem in that the voltage resolution of the obtained digital value becomes rough and the precision of the A/D conversion can not be maintained.

For the A/D conversion apparatus that requires the A/D conversion speed and precision, therefore, an expensive sequential comparison-type or parallel-type A/D conversion unit having a construction more complex than the above integration-type A/D conversion unit is used. This hinders the effort for realizing the A/D conversion apparatus in small size and at decreased cost.

SUMMARY OF THE INVENTION

The present invention therefore has an object of providing an A/D conversion method by using an A/D conversion unit which is simply constructed and which converts analog signals into digital signals at high speed and high precision, as well as to provide an apparatus therefor.

According to the present invention, an A/D conversion apparatus includes four A/D conversion units. Each unit comprises ring delay lines, pulse selectors for detecting the positions reached by pulse signals in the ring delay lines, encoders for converting the reached positions that are detected into ma-bit digital values, mb-bit counters for counting the number of times the pulse signals have circulated through the ring delay lines, and latch circuits for latching the results counted by the counters. A control circuit sends digital values obtained from the A/D conversion units to a signal processing circuit which adds up together the digital values to calculate a digital value having the number of bits larger than that of the initial digital value.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment)

Figure 1:
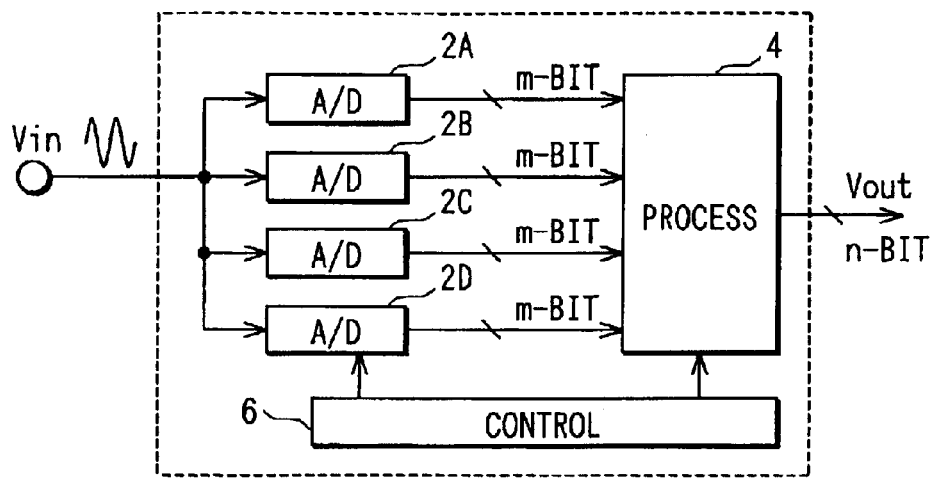
FIG. 1 is a block diagram illustrating an A/D conversion apparatus according to a first embodiment of the present invention.

Referring to FIG. 1, an A/D conversion apparatus according to this embodiment comprises four integration-type A/D conversion units 2A, 2B, 2C and 2D for converting an analog signal Vin input from an external unit into m-bit digital values, a signal processing circuit 4 for adding up together the A/D-converted results (m-bit digital values) obtained through the A/D conversion units 2A to 2D to form an n-bit (n=m+2) digital value which is produced as an A/D-converted result Vout, and a control circuit 6 for controlling the operation time points of these units.

Figure 2:
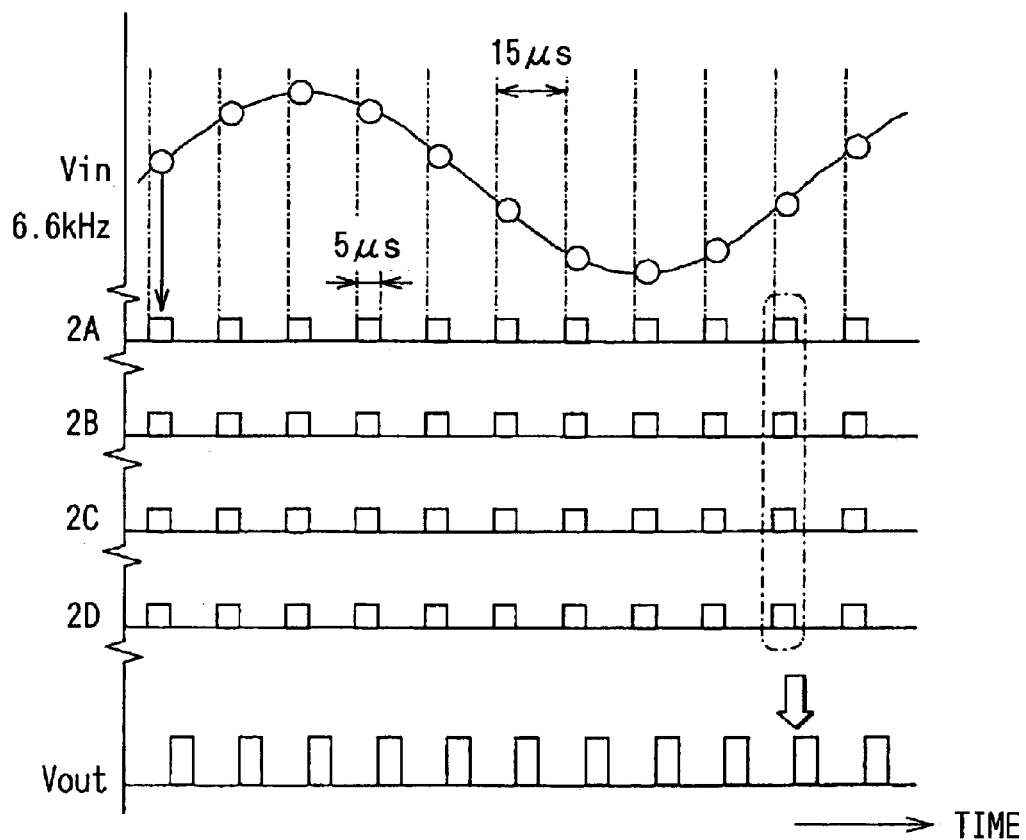
FIG. 2 is a signal diagram illustrating the operation of the A/D conversion apparatus according to the first embodiment.

As illustrated in FIG. 2, the control circuit 6 operates the A/D converters 2A to 2D simultaneously at every predetermined interval (at every interval of 15 μsec in the figure) for a predetermined A/D conversion time (5 μsec in the figure), so that m-bit digital values are sent to the signal processing circuit 4 from the A/D conversion units 2A to 2D and, then, causes the signal processing circuit 4 to execute the addition of these digital values, so that an n-bit digital value is output as an A/D-converted result Vout from the signal processing circuit 4.

According to the A/D conversion apparatus of this embodiment, therefore, there is formed a digital value of a resolution higher by2 bits than the digital values obtained through the A/D conversion units 2A to 2D, and the resolution is enhanced without the need of lengthening the A/D conversion time in the A/D conversion units 2A to 2D.

According to this embodiment, therefore, there is easily realized an A/D conversion apparatus which is capable of executing the A/D conversion at a high speed maintaining a high precision.

In the signal diagram of FIG. 2, the control circuit 6 operates the A/D conversion units 2A to 2D for 5 μsec at every predetermined interval of 15 μsec to subject the analog signal Vin of 6.6 kHz to the A/D conversion. When the analog signal Vin of 6.6 kHz is subjected to the A/D conversion by using only one integration-type A/D conversion unit like in this embodiment, the digital value obtained as an A/D-converted result Vout has a low resolution, and the analog signal Vin is not correctly processed in a digital manner. If the A/D conversion time in the A/D conversion unit is lengthened to enhance the resolution, the sampling period for putting the analog signal Vin to the A/D conversion must be set to be longer than 15 μsec making it difficult to correctly process the analog signal Vin in a digital manner.

According to this embodiment, however, the analog signal Vin is simultaneously put to the A/D conversion by using the four A/D conversion units 2A to 2D, and the A/D-converted results are added up together to enhance, by 2 bits, the resolution of a digital value obtained as the A/D-converted result Vout. Therefore, the analog signal Vin of 6.6 kHz can be put to the A/D conversion so as to be processed in a digital manner.

(Second Embodiment)

Figure 3:
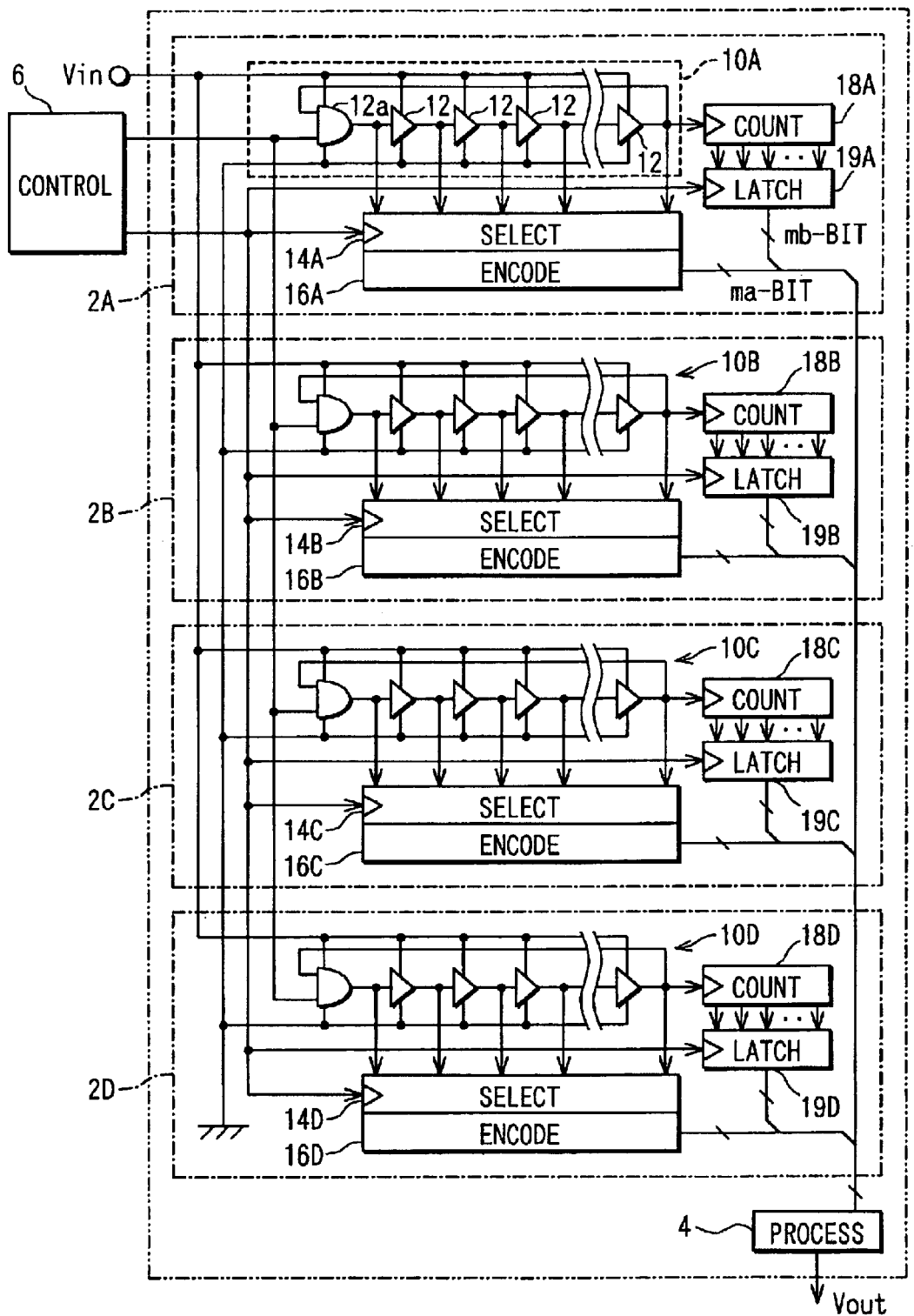
FIG. 3 is a circuit diagram illustrating an A/D conversion apparatus according to a second embodiment of the present invention.

FIG. 3 illustrates the A/D conversion apparatus according to a second embodiment by constructing the A/D conversion units 2A to 2D so that they can effect the A/D conversion by utilizing the delay lines.

Referring to FIG. 3, the A/D conversion units 2A to 2D are constructed by ring delay lines 10A to 10D each having a plurality of delay elements 12 for producing an input signal by delaying it by a delay time that varies depending upon the voltage of the analog signal Vin that is fed as a power-source voltage, the delay elements 12 being coupled like a ring so as to circulate the pulse signal; pulse selectors 14A to 14D that receive outputs from the delay elements 12 forming the ring delay lines 10A to 10D, and detect the positions where the pulse signals are arriving in the ring delay lines 10; encoders 16A to 16D for converting the positions reached by the pulse signals as detected by the pulse selectors 14A to 14D into ma-bit digital values; mb-bit counters 18A to 18D for counting the number of times the pulse signals have circulated through the ring delay lines 10A to 10D; and latch circuits 19A to 19D for latching the results counted by the counters 18A to 18D.

The control circuit 6 inputs a start pulse signal simultaneously to the ring delay lines 10A to 10D in the A/D conversion units 2A to 2D, so that the pulse signal is transmitted from the starter delay element 12a to the delay element 12 in the last stage successively in the ring delay lines 10A to 10D. After the path of a predetermined A/D conversion time (e.g., 5 μsec), the control circuit 6 sends an instruction signal to the pulse selectors 14A to 14D and to the latch circuits 19A to 19D, so that the pulse selectors 14A to 14D detect the positions and that the latch circuits 19A to 19D work to latch the counted values.

As a result, the encoders 16A to 16D produce ma-bit digital values representing the positions reached by the pulse signals as detected by the pulse selectors 14A to 14D, and the latch circuits 19A to 19D produce mb-bit digital values representing the number of times the pulse signals have circulated through the ring delay lines 10A to 10D as counted by the counters 18A to 18D. These digital values are input to the signal processing circuit 4 as m-bit digital values with the ma-bit digital values as the lower side (least significant bit side) and the mb-bit digital values as the higher side (most significant bit side).

The signal processing circuit 4 adds up together the m-bit digital values from the A/D conversion units 2A to 2D to form an n-bit digital value which is output as an A/D-converted result Vout.

Accordingly, the A/D conversion apparatus of this embodiment exhibits the same effect as that of the A/D conversion apparatus of the first embodiment. Besides, since the A/D conversion units 2A to 2D are the integration-type A/D conversion units that effect the A/D conversion by utilizing the ring delay lines 10A to 10D, the A/D conversion apparatus is constructed very simply and in a small size.

Figure 4A:
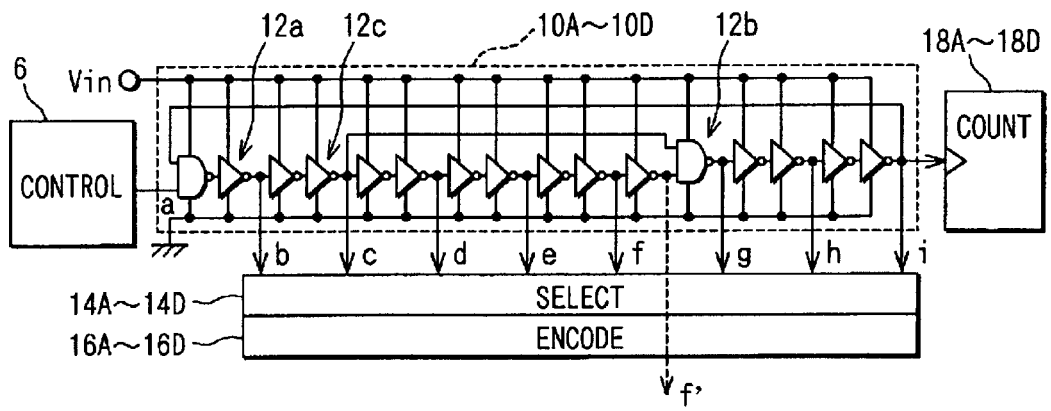
FIGS. 4A and 4B are a circuit diagram illustrating a ring delay line used in the second embodiment and a signal diagram illustrating the operation of the ring delay line, respectively.

The A/D conversion units 2A to 2D of this embodiment have been widely known as disclosed in the above U.S. Pat. No. 5,834,636(JP-A-5-259907), and are not described here in detail. Here, however, the ring delay lines 10A to 10D are constructed, as shown in FIG. 4A, by eight delay elements 12 so as to form 3-bit digital values for representing the circulating positions of the pulse signals. Among them, the starter delay element 12a is constructed by a NAND gate and an inverter. Among the succeeding delay elements 12, a particular delay element 12b (sixth stage in the figure with the starter delay element as the first stage) is constructed by an inverter and a NAND gate, and the remaining delay elements 12 (six delay elements) are each constructed by two inverters, and an input terminal of the NAND gate of the delay element 12b on the side that is not connected like the ring, is connected to the output (point c in the figure) of the other delay element 12c (delay element of the second stage in the drawing with the starter delay element as the initial stage).

Figure 4B:
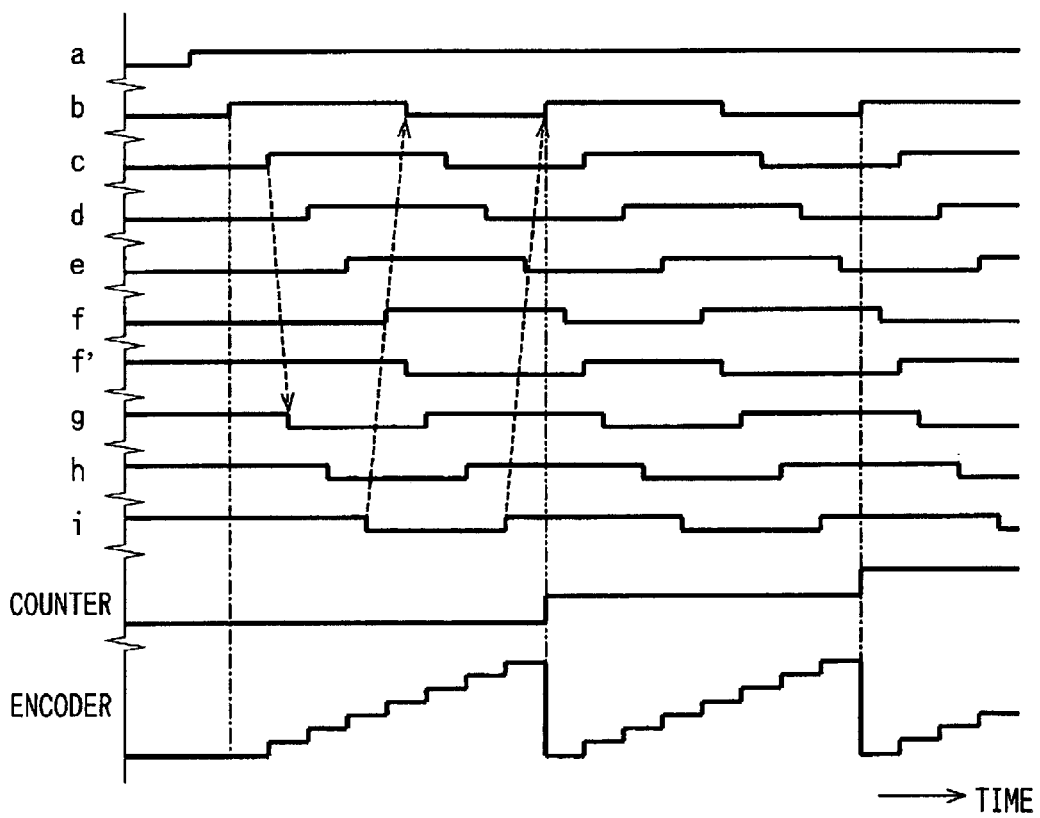

With the ring delay lines 10A to 10D, the output from the delay element 12b is forcibly broken down at the rise of the output (point c) from the delay element 12c as shown in FIG. 4B. Even when the A/D conversion units 2A to 2D are constructed by gate circuits of an even number, it is allowed to circulate the pulse signals in the A/D conversion units 2A to 2D.

In the ring delay lines 10A to 10D as will be obvious from FIG. 4B, when a pulse signal is sent from the control circuit 6 to the input terminal of the NAND gate forming the starter delay element 12a on the side of not connected like the ring, the pulse signal circulates through the ring delay lines 10A to 10D while being delayed by predetermined times through the delay elements 12, whereby the outputs of the encoders 16A to 16D undergo a change in eight steps depending upon the circulating positions of the pulse signals in the ring delay lines 10A to 10D, and three-bit digital values are formed from the changes thereof.

Figure 5:
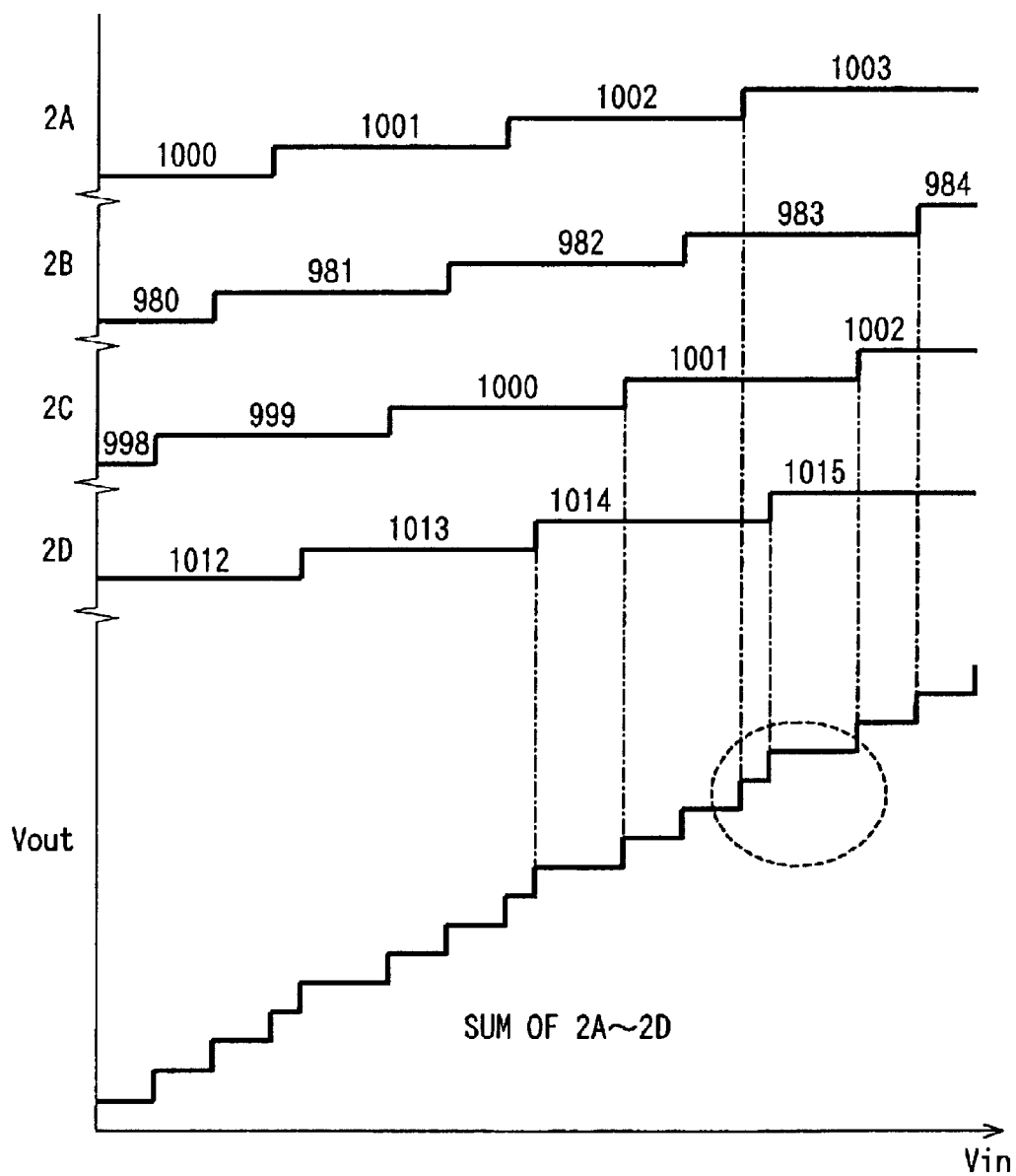
FIG. 5 is a signal diagram illustrating an A/D-converted result by the A/D conversion apparatus of the second embodiment.

Here, when the A/D conversion units 2A to 2D are constructed by using ring delay lines 10A to 10D so as to put the analog signal Vin to the A/D conversion, the delay times through the delay elements 12 undergo dispersion to some extent due to the arrangement of the delay elements 12 forming the ring delay lines 10A to 10D and due to dispersion during the production. As the pulse signals circulate through the ring delay lines 10A to 10D, therefore, dispersion in the delay time is accumulated. Even when the input voltage (voltage of analog signal Vin) to the delay elements 12 remains the same, therefore, the digital values obtained through the A/D conversion units 2A to 2D differ greatly as represented by a circle in FIG. 5. Therefore, a good A/D-converted result Vout is not obtained through the above processing of addition.

In such a case as will be discussed in the third embodiment hereinbelow, the analog signal Vin is held by using sample-holding circuits, is put to the A/D conversion a plural number of times through the A/D conversion units 2A to 2D during the period of sample holding, and the digital values obtained through the A/D conversion are added up or averaged. Further, the digital values obtained through the A/D conversion units 2A to 2D may be averaged through the signal processing circuit 4.

When the digital values obtained through the A/D conversion units 2A to 2D are in nearly agreement with one another, the addition processing or the averaging processing through the signal processing circuit 4 simply results in an increase in the number of bits of the finally obtained A/D-converted result Vout without really improving the precision in the A/D conversion.

Figure 6:
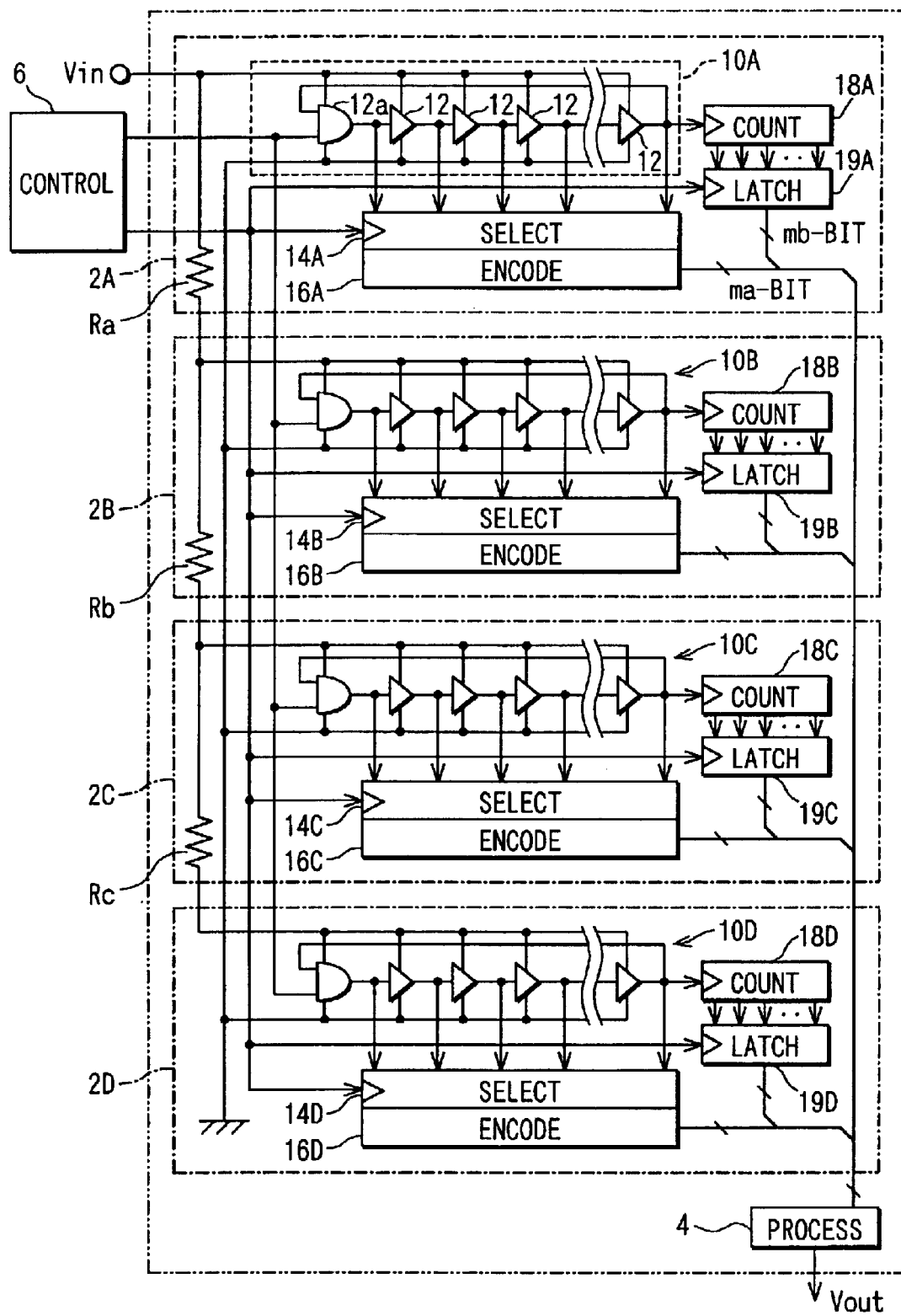
FIG. 6 is a circuit diagram illustrating a modified example of the A/D conversion apparatus according to the second embodiment.

To overcome this problem as shown in, for example, FIG. 6, resistors Ra, Rb and Rc may be provided in a path for transmitting the analog signal Vin from the A/D conversion unit 2A to the A/D conversion unit 2B, in a path for transmitting the analog signal Vin from the A/D conversion unit 2B to the A/D conversion unit 2C, and in a path for transmitting the analog signal Vin from the A/D conversion unit 2C to the A/D conversion unit 2D, to disperse, to some extent, the voltage of the analog signal Vin input to the A/D conversion units 2A to 2D.

(Third Embodiment)

Figure 7:
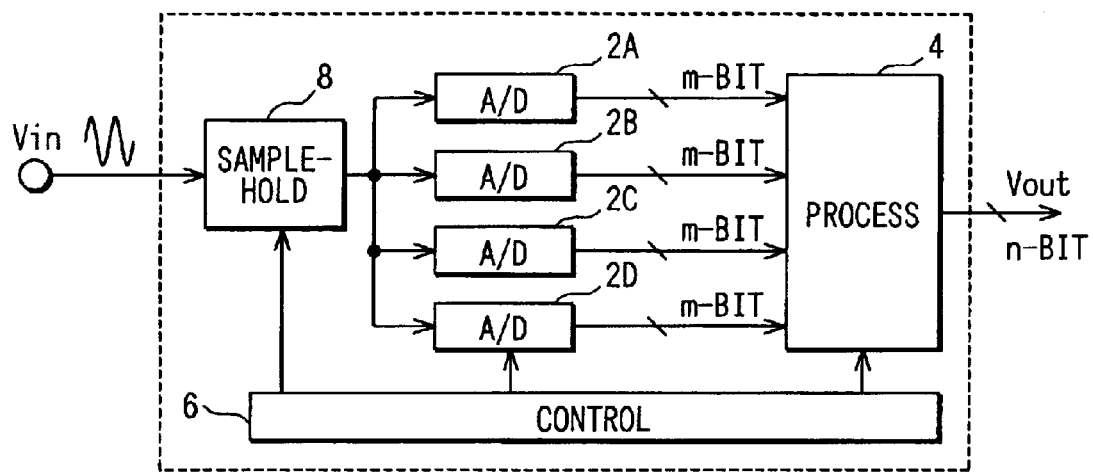
FIG. 7 is a block diagram illustrating an A/D conversion apparatus according to a third embodiment of the present invention.

Next, FIG. 7 illustrates the A/D conversion apparatus according to a third embodiment. The A/D conversion apparatus of this embodiment further includes a sample-holding circuit 8 for sample-holding the analog signal Vin.

Figure 8:
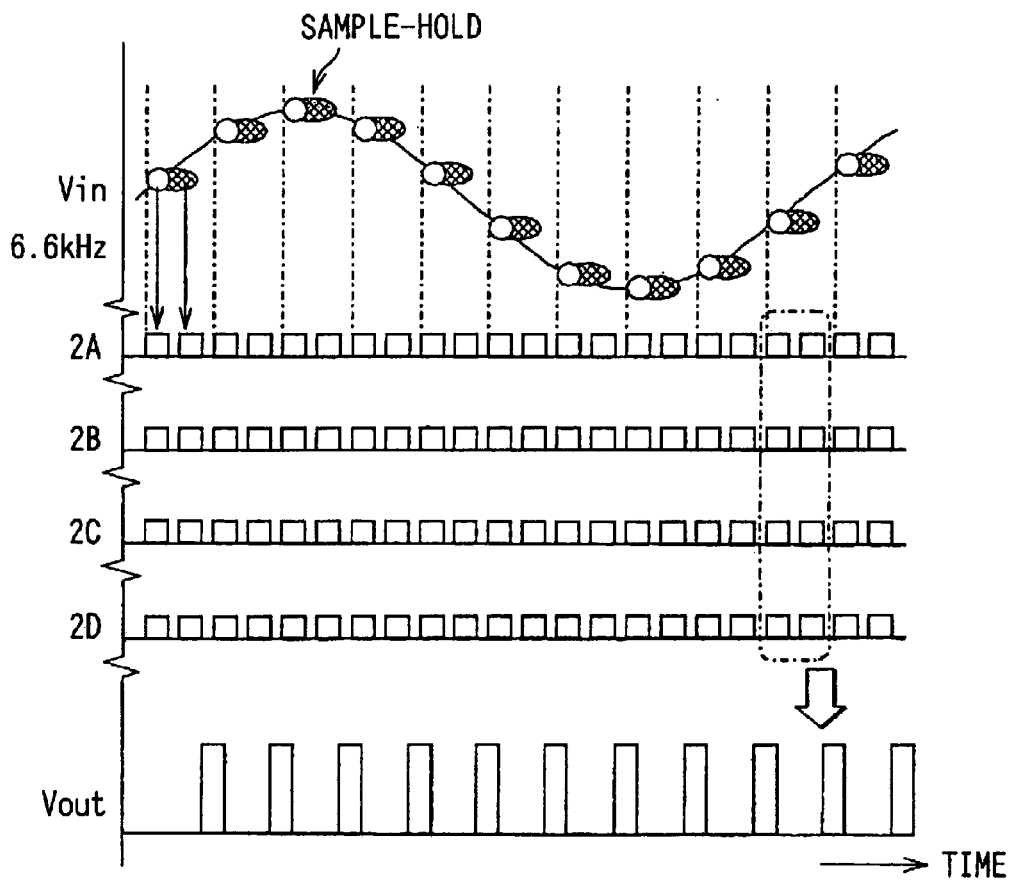
FIG. 8 is a signal diagram illustrating the operation of the A/D conversion apparatus according to the third embodiment.

In this A/D conversion apparatus as shown in FIG. 8, the control circuit 6 operates the sample-holding circuit 8 for a sample-holding period required by the A/D conversion units 2A to 2D to execute the A/D conversion twice at every predetermined interval, so as to hold the analog signal Vin. During the sample-holding period, further, the A/D conversion units 2A to 2D are operated twice consecutively, m-bit digital signals obtained through the A/D conversion units 2A to 2D by the A/D conversion operation of two times, are successively input to the signal processing circuit 4 and, then, a total of eight (=4×two times) digital values are added up together through the signal processing circuit 4 at the completion of the two times of A/D conversion.

According to the A/D conversion apparatus of this embodiment, as a result, there is obtained a digital value having a resolution higher by three bits than the digital values obtained through the individual A/D conversion units 2A to 2D. Thus, the voltage resolution of the A/D-converted result Vout becomes higher than that of the A/D conversion apparatus of the first embodiment or the second embodiment.

Further, when the analog signal Vin is held by using the sample-holding circuit 8 and the A/D conversion is effected twice during the sample-holding period, the number of the A/D conversion units may be decreased from four to two if the voltage resolution of the finally obtained A/D-converted results Vout may be the same as those of the above embodiments, in order to further simplify the construction of the apparatus.

(Fourth Embodiment)

Figure 9:
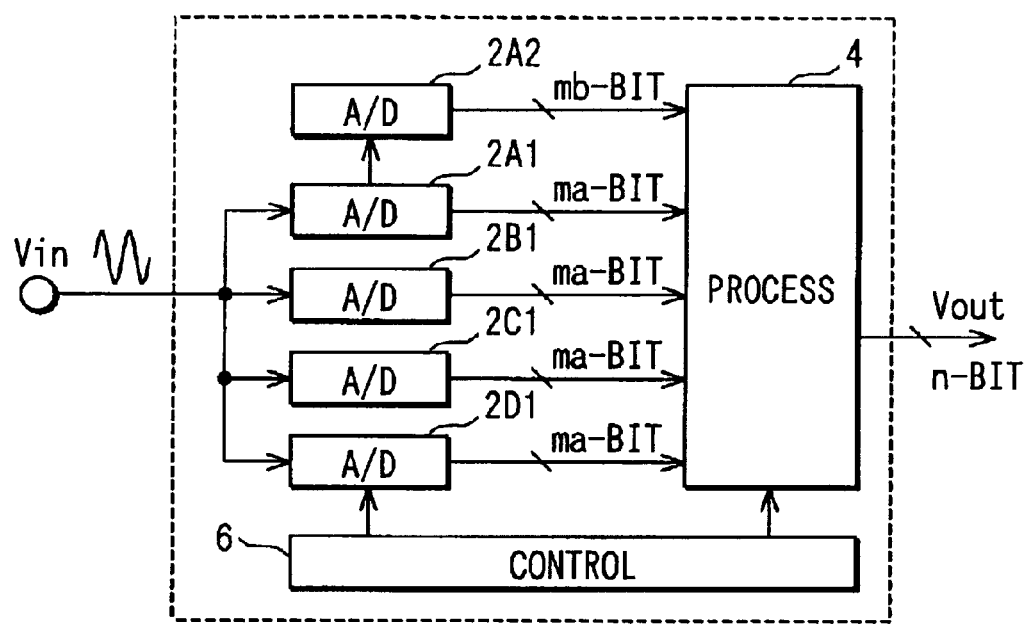
FIG. 9 is a block diagram illustrating an A/D conversion apparatus according to a fourth embodiment of the present invention.

FIG. 9 is a block diagram illustrating the A/D conversion apparatus according to a fourth embodiment.

The A/D conversion apparatus of this embodiment is constructed by a pair of A/D conversion units 2A1 and 2A2 for converting the analog signal Vin input from an external unit into a m-bit (m=mb+ma) digital value composed of a lower side of ma bits and a higher side of mb bits; A/D conversion units 2B1, 2C1 and 2D1 for converting the analog signal Vin into a digital value of ma bits; a signal processing circuit 4 which forms a digital value of mc bits (mc=ma+2) by adding up together the ma-bit digital values obtained through the A/D conversion units 2A1, 2B1, 2C1 and 2D1, and produces, as an A/D-converted result Vout, an n-bit (n=mb+mc) digital value with the mc-bit digital value as the lower side and with the mb-bit digital value obtained through the A/D conversion unit 2A2 as the higher side; and a control circuit 6 for controlling the operation time points of these portions.

The control circuit 6 operates the A/D conversion units 2A1 to 2D1 and 2A2 simultaneously, so that ma-bit digital values and mb-bit digital value are output to the signal processing circuit 4 from the A/D conversion units 2A1 to 2D1 and 2A2, and causes the signal processing circuit 4 to add up the digital values together, so that an n-bit digital value is output as an A/D-converted result Vout from the signal processing circuit 4.

According to this embodiment, therefore, there is realized an A/D conversion apparatus that operates at high speeds maintaining a high resolution at a low cost, like the A/D conversion apparatuses of the above embodiments. According to this embodiment, further, the m-bit digital value is formed by using the A/D conversion units 2A1 and 2A2, and the signal processing circuit 4 executes the processing of addition for only the ma-bit digital values obtained from the A/D conversion units 2A1 to 2D1. It is therefore made possible to decrease the scale of circuit as compared to the A/D conversion apparatuses of the above embodiments and, hence, to realize the A/D conversion apparatus in a small size.

(Fifth Embodiment)

Figure 10:
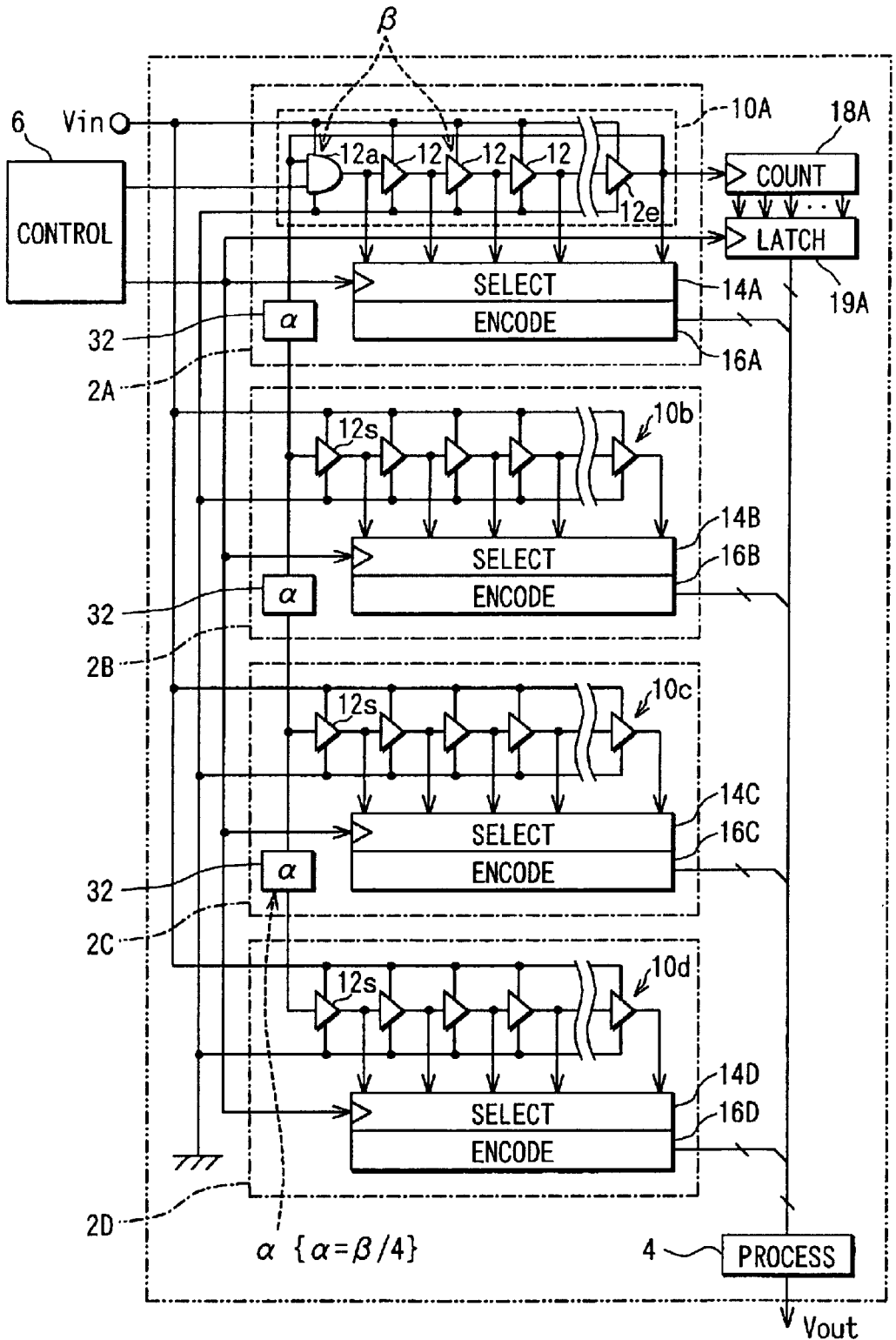
FIG. 10 is a circuit diagram illustrating the A/D conversion apparatus according to a fifth embodiment of the present invention.

FIG. 10 illustrates the A/D conversion apparatus according to a fifth embodiment. This A/D conversion apparatus is constructed by four A/D conversion units 2A to 2D, the signal processing circuit 4 and the control circuit 6 like the A/D conversion apparatus of the second embodiment shown in FIG. 3.

Among the four A/D conversion units 2A to 2D, the A/D conversion unit 2A is constructed by a ring delay line 10A, a pulse selector 14A, an encoder 16A, and counters 18A to 18D like the A/D conversion unit 2A of the second embodiment, and forms lower (least significant) ma-bit of the m-bit digital value in response to the operation of the pulse selector 14A and the encoder 16A, forms the higher (most significant) mb-bit of the m-bit digital value in response to the operation of the counter 18A and the latch circuit 19A, and sends a digital value of a total of m bits to the signal processing circuit 4.

The A/D conversion units 2B to 2D are constructed by delay lines 10b to 10d formed by successively coupling the delay elements 12 in the same number as that of the ring delay line 10A; pulse selectors 14B to 14D for detecting the positions reached by the pulse signals in the delay lines 10b to 10d; and encoders 16B to 16D for converting the positions reached by the pulse signals as detected by the pulse selectors 14B to 14D into ma-bit digital values; and work to output the ma-bit digital values converted through the encoders 16B to 16D to the signal processing circuit 4.

The delay lines 10b to 10d are those in which the plurality of delay elements 12 are simply coupled in succession, and are not capable of circulating the pulse signals unlike the ring delay line 10A. Therefore, a pulse signal that is returned back to the starter delay element 12a from the delay element 12e in the last stage of the ring delay line 10A, is input to the delay elements 12s in the initial stages of the delay lines 10b to 10d. Delay elements 32 for delaying the pulse signal by a delay time α (α<β/4) are provided in a path for transmitting the pulse signal from the ring delay line 10A to the delay line 10b, in a path for transmitting the signal from the delay line 10b to the delay line 10c, and in a path for transmitting the pulse signal from the delay line 10c to the delay line 10d, such that the phases of the pulse signals passing through the delay lines 10A to 10d are deviated in a range smaller than the delay time β per stage of the delay element 12. The delay time β is defined as one half of a difference between a maximum delay time and a minimum delay time. In this embodiment, the delay element may not be particularly provided but, instead, the wiring delay may be utilized.

Next, the control circuit 6 inputs the pulse signal to the starter delay element 12a in the ring delay line 10A, so that the pulse signal circulates in the ring delay line 10A. After the path of a predetermined A/D conversion time (first time) required for the A/D conversion on the ring delay line 10A, the control circuit 6 sends an instruction signal to the pulse selectors 14A to 14D and to the latch circuit 19A, so that the pulse selectors 14A to 14D detect the positions and that the latch circuit 19A latches the counted value.

As a result, the encoder 16A in the A/D conversion unit 2A produces an ma-bit digital value representing a position reached by the pulse signal as detected by the pulse selector 14A, and the latch circuit 19A produces a mb-bit digital value representing the number of times the pulse signal has circulated through the ring delay line 10A as counted by the counter 18A. These digital values are input to the signal processing circuit 4 as m-bit digital values with the ma-bit digital value serving as the lower side and the mb-bit digital value serving as the higher side.

Further, the delay lines 10b to 10d in the A/D conversion unit 2B to 2D receive a pulse signal every time when the pulse signal circulates in the ring delay line 10A in the A/D conversion unit 2A. In the A/D conversion units 2B to 2D, therefore, the positions reached by the pulse signals on the delay lines 10b to 10d are detected by the pulse selectors 14B to 14D at the same time point as the one in the A/D conversion unit 2A, and ma-bit digital values representing the reached positions as detected by the pulse selectors 14B to 4C are output to the signal processing circuit 4 from the encoders 16B to 16C.

Like in the fourth embodiment, the signal processing circuit 4 adds up together the ma-bit digital values obtained from the A/D conversion units 2A to 2D to form a mc-bit (mc=ma+2) digital value, and an n-bit (n=mb+mc) digital value is produced as the A/D-converted result Vout with the c-bit digital value as the lower side and the higher mb-bit digital value obtained from the A/D conversion unit 2A as the higher side.

According to the A/D conversion apparatus of this embodiment, the A/D conversion unit 2A forms an m-bit digital value like in the A/D conversion apparatus of the above fourth embodiment, and the other A/D conversion units 2B to 2D put the lower ma-bit of the m-bit digital value to the A/D conversion. It is therefore allowed to execute the A/D conversion at high speeds and highly precisely, as well as to decrease the scale of the circuit to realize an A/D conversion apparatus which is constructed in a small size.

Figure 11A:
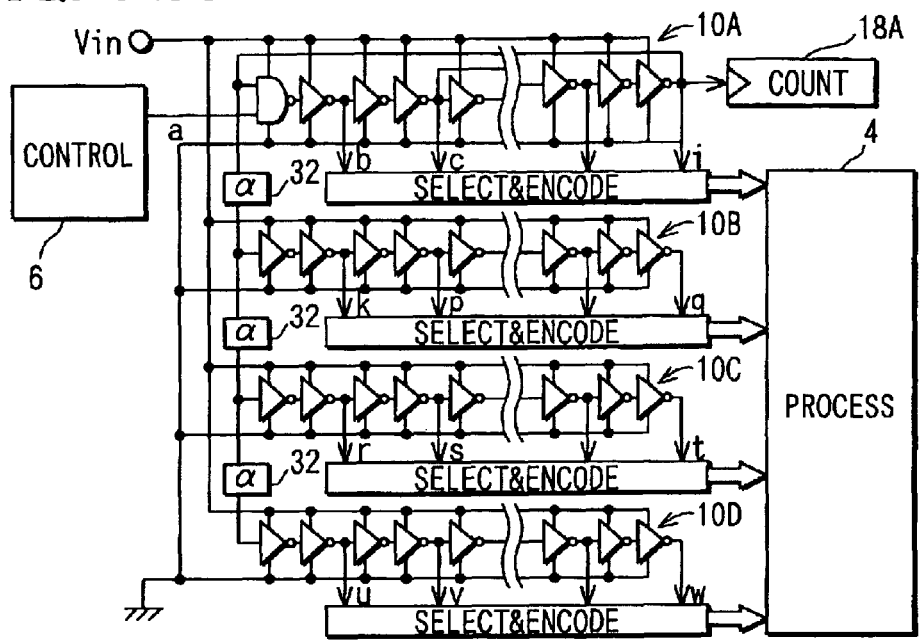
FIGS. 11A and 11B are a circuit diagram illustrating a ring delay line and delay lines used in the fifth embodiment and a signal diagram illustrating the operation of the ring delay line.
Figure 11B:
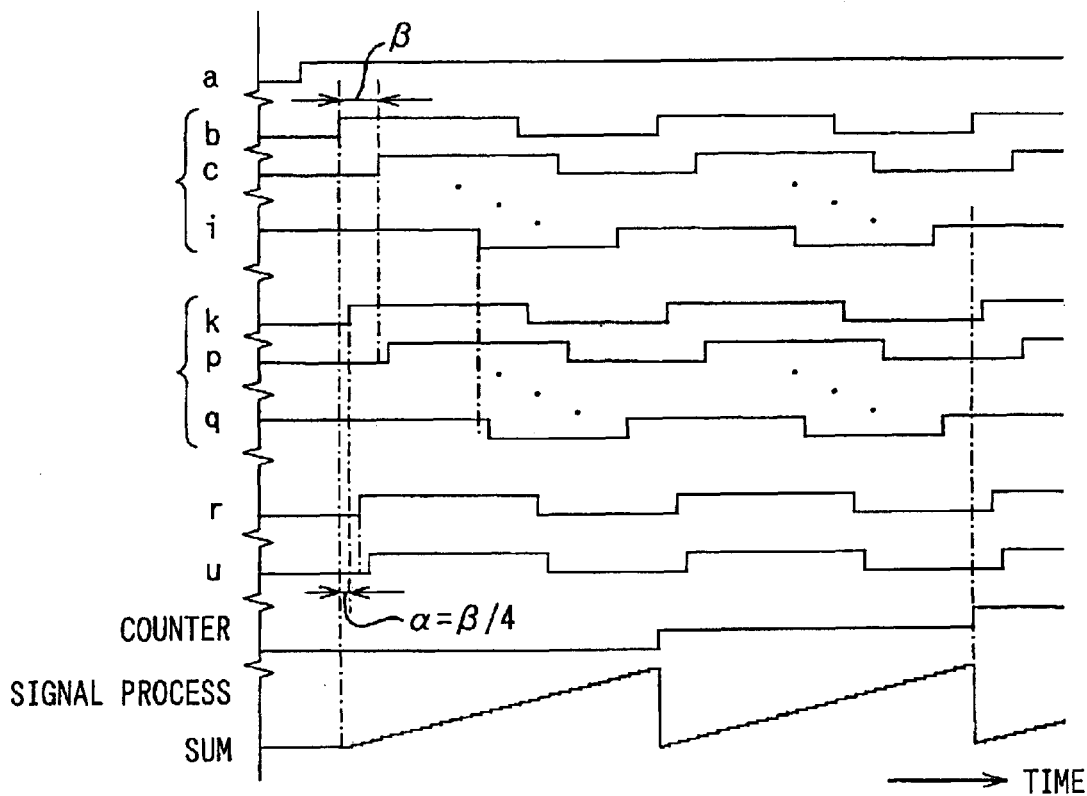

In the A/D conversion apparatus of this embodiment as shown in FIGS. 11A and 11B, further, delay elements 32 for delaying the pulse signal by the delay time α (α<β/4) are disposed in the paths for transmitting the pulse signal from the ring delay line 10A to the delay lines 10b to 10d in order to forcibly shift the phase of the pulse signal passing through the delay lines 10A to 10d. Therefore, the result of addition of ma bits digital values through the signal processing circuit 4 varies nearly continuously (or, in other words, linearly) depending upon the positions reached by the pulse signal in the delay lines 10A to 10d.

Figure 12:
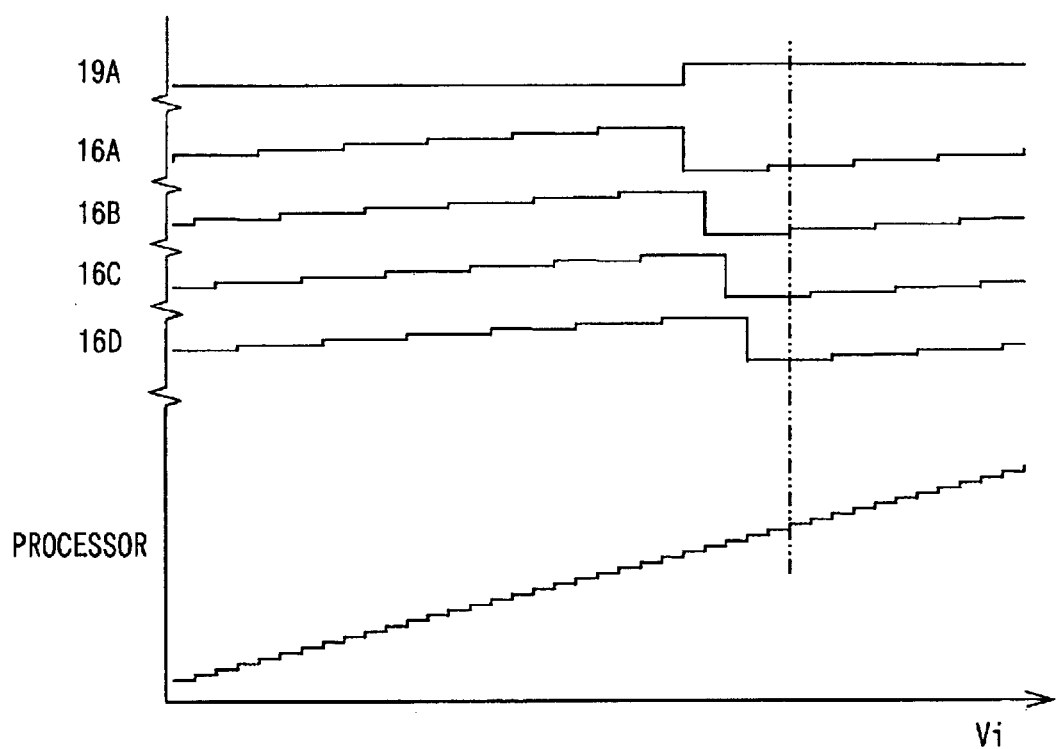
FIG. 12 is a signal diagram illustrating the A/D conversion characteristics of the A/D conversion apparatus according to the fifth embodiment.

Referring to FIG. 12, the digital value output from the signal processing circuit 4 as the A/D-converted result Vout varies in proportion to the input voltage (voltage of the analog signal Vin) and further improves the precision of A/D conversion.

FIG. 11A illustrates the ring delay line 10A and of the delay lines 10b to 10d, and FIG. 11B illustrates changes in the pulse signals output to the pulse selectors 14A to 14D from the ring delay line 10A and from the delay lines 10b to 10d. In this figure, the ring delay line 10A is constructed in the same manner as the one shown in FIG. 4A. In the delay lines 10b to 10d, the delay elements 12 are all constructed by two inverters.

(Sixth Embodiment)

Figure 13:
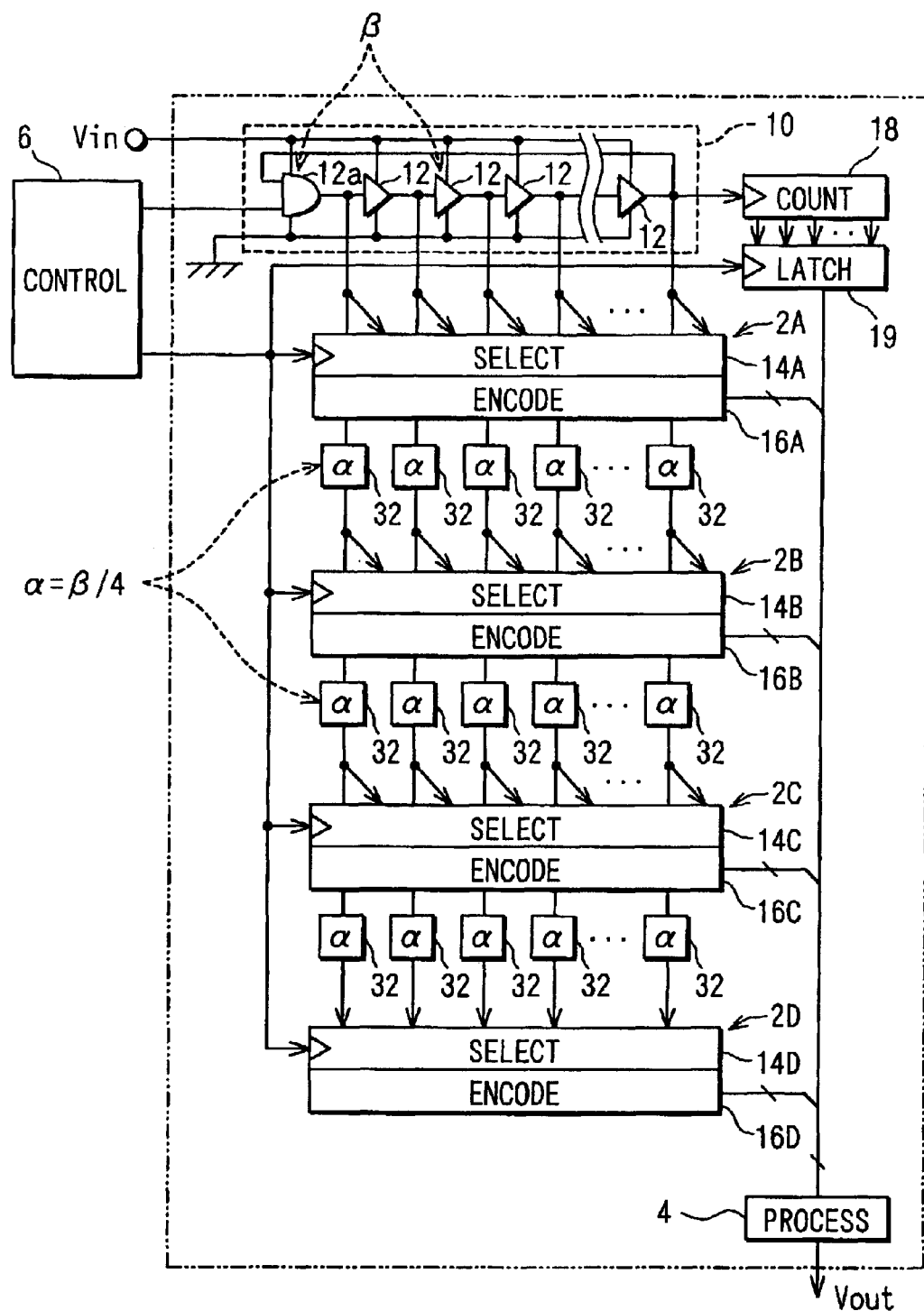
FIG. 13 is a circuit diagram illustrating an A/D conversion apparatus according to a sixth embodiment of the present invention.

Next, FIG. 13 illustrates the A/D conversion apparatus according to a sixth embodiment. This A/D conversion apparatus is constructed by four A/D conversion units 2A to 2D, the signal processing circuit 4 and the control circuit 6 like the A/D conversion apparatus of the fifth embodiment.

This embodiment is different from the fifth embodiment in that the delay lines used for the A/D conversion in the A/D conversion units 2A to 2D are constructed by a ring delay line 10 which is common for the A/D conversion units 2A to 2D, that the A/D conversion units 2A to 2D are constructed by pulse selectors 14A to 14D for detecting the positions reached by the pulse signal in the ring delay line 10, and encoders 16A to 16D, and that there are separately provided a counter 18 for counting the number of times the pulse signal has circulated through the ring delay line 10, and a latch circuit 19.

In the A/D conversion apparatus, further, the ring delay line 10 is common for the A/D conversion units 2A to 2D, and no delay element 32 is provided in the paths for transmitting the pulse signal from the ring delay line 10A to the other delay lines 10b to 10d unlike that of the A/D conversion unit of the fifth embodiment. Therefore, delay elements 32 having a delay time like that of the delay elements 32 are provided on the paths for transmitting the pulse signals from the ring delay line 10 to the A/D conversion units 2B, 2C, 2D.

The thus constructed A/D conversion apparatus of the sixth embodiment makes it possible to obtain the same effect as that of the A/D conversion apparatus of the fifth embodiment and, besides, the delay line used for the A/D conversion in the A/D conversion units 2A to 2D is constructed by a single ring delay line 10, making it possible to further simplify the circuit construction compared to that of the A/D conversion apparatus of the fifth embodiment and to realize the apparatus in a small size.

(Seventh Embodiment)

Figure 14:
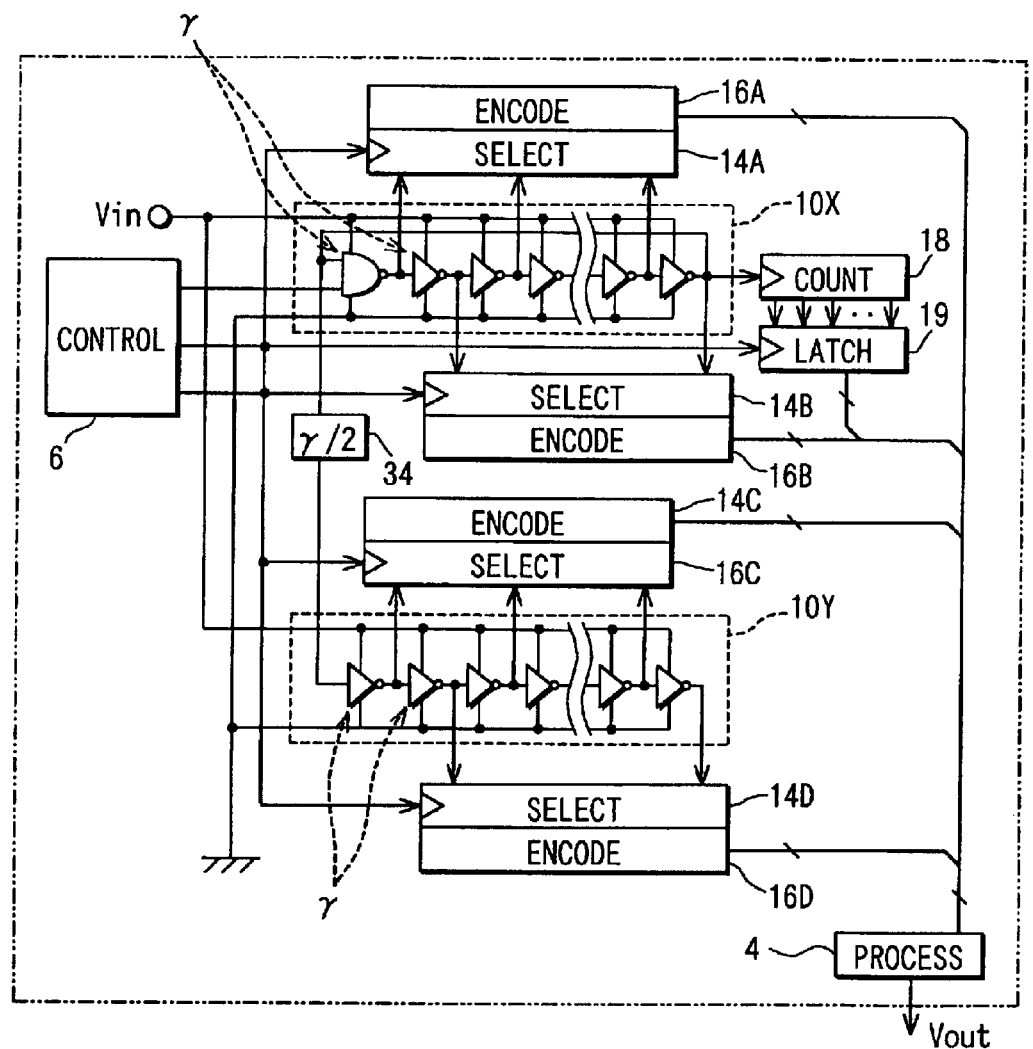
FIG. 14 is a circuit diagram illustrating an A/D conversion apparatus according to a seventh embodiment of the present invention.

Next, FIG. 14 illustrates the A/D conversion apparatus according to a seventh embodiment. This A/D conversion apparatus is constructed by four A/D conversion units 2A to 2D, the signal processing circuit 4 and the control circuit 6 like the A/D conversion apparatus of the sixth embodiment.

This embodiment is different from the sixth embodiment in that there are provided, as delay lines for the A/D conversion, two delay lines including a ring delay line 10X in common for the A/D conversion units 2A, 2B and a delay line 10Y in common for the A/D conversion units 2C, 2D to transmit pulse signals from the ring delay line 10X to the delay line 10Y like in the fifth embodiment, that a delay element 34 for delaying the pulse signal by a delay time γ/2 (γ=β/2) is separately provided in the path for transmitting the pulse signals so that the phase of the pulse signal passing through the delay lines 10X and 10Y is shifted within a range smaller than the delay time β per a stage of the delay element 12, and that the outputs of two gate circuits forming the delay elements 12 in the corresponding delay lines 10X, 10Y are alternately connected to the pulse selectors 16A to 16D in the A/D conversion units 2A to 2D.

In the thus constructed A/D conversion apparatus of this embodiment, too, the units operate in the same manner as those of the A/D conversion apparatus of the fifth embodiment to exhibit the same effect as that of the fifth embodiment. Besides, the circuit construction is simplified compared to that of the A/D conversion apparatus of the fifth embodiment to realize the apparatus in a small size.

In this embodiment, the outputs of two gate circuits forming the delay elements in the corresponding delay lines 10X and 10Y are alternately connected to the pulse selectors 16A to 16D. It is therefore desired to correct the response characteristics of the gate circuit when they differ depending upon the rise and break in order to maintain precision in the A/D conversion.

(Eighth Embodiment)

Figure 15:
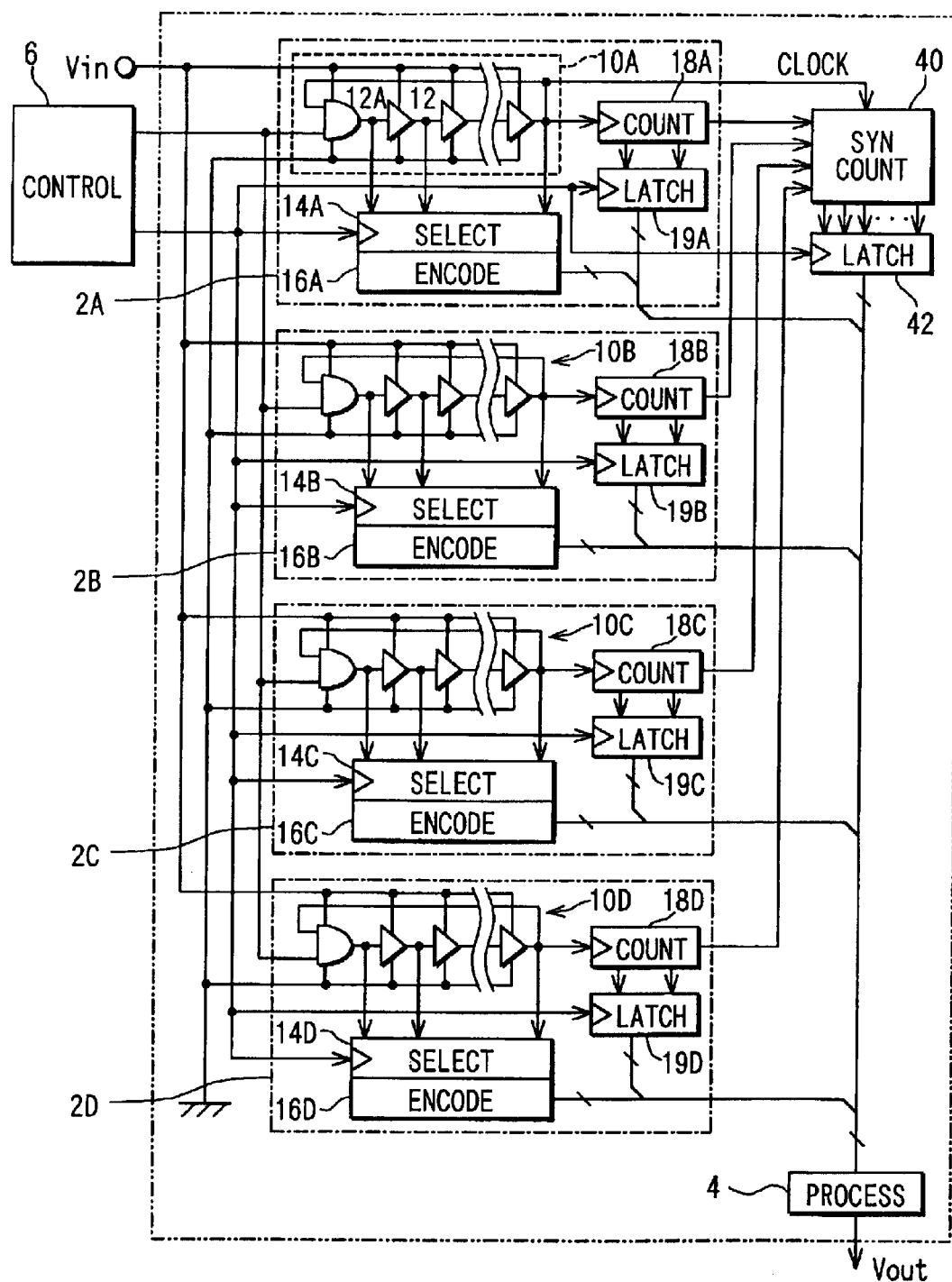
FIG. 15 is a circuit diagram illustrating an A/D conversion apparatus according to an eighth embodiment of the present invention.

FIG. 15 illustrates the A/D conversion apparatus according to an eighth embodiment. As an upper counter for the counters 18A to 18D forming the A/D conversion units 2A to 2D, the A/D conversion apparatus is provided with a synchronous counter 40 for counting the outputs of the counters 18A to 18D upon receiving, as synchronizing clocks, the pulse signals output to the counter 18A from the ring delay line 10A. The A/D conversion apparatus is further provided with a latch circuit 42 which latches the outputs of the synchronous counter 40 at the same time points as the lower latch circuits 19A to 19D, and sends the outputs to the signal processing circuit 4.

According to this A/D conversion apparatus, the number of bits of the counters 18A to 18D forming the A/D conversion units 2A to 2D can be decreased (2 bits in the figure), and the higher bits can be counted by the synchronous counter which is common for the counters 18A to 18D, making it possible to decrease the circuit scale in the A/D conversion apparatus as a whole and to decrease the size of the A/D conversion apparatus.

(Ninth Embodiment)

Figure 16:
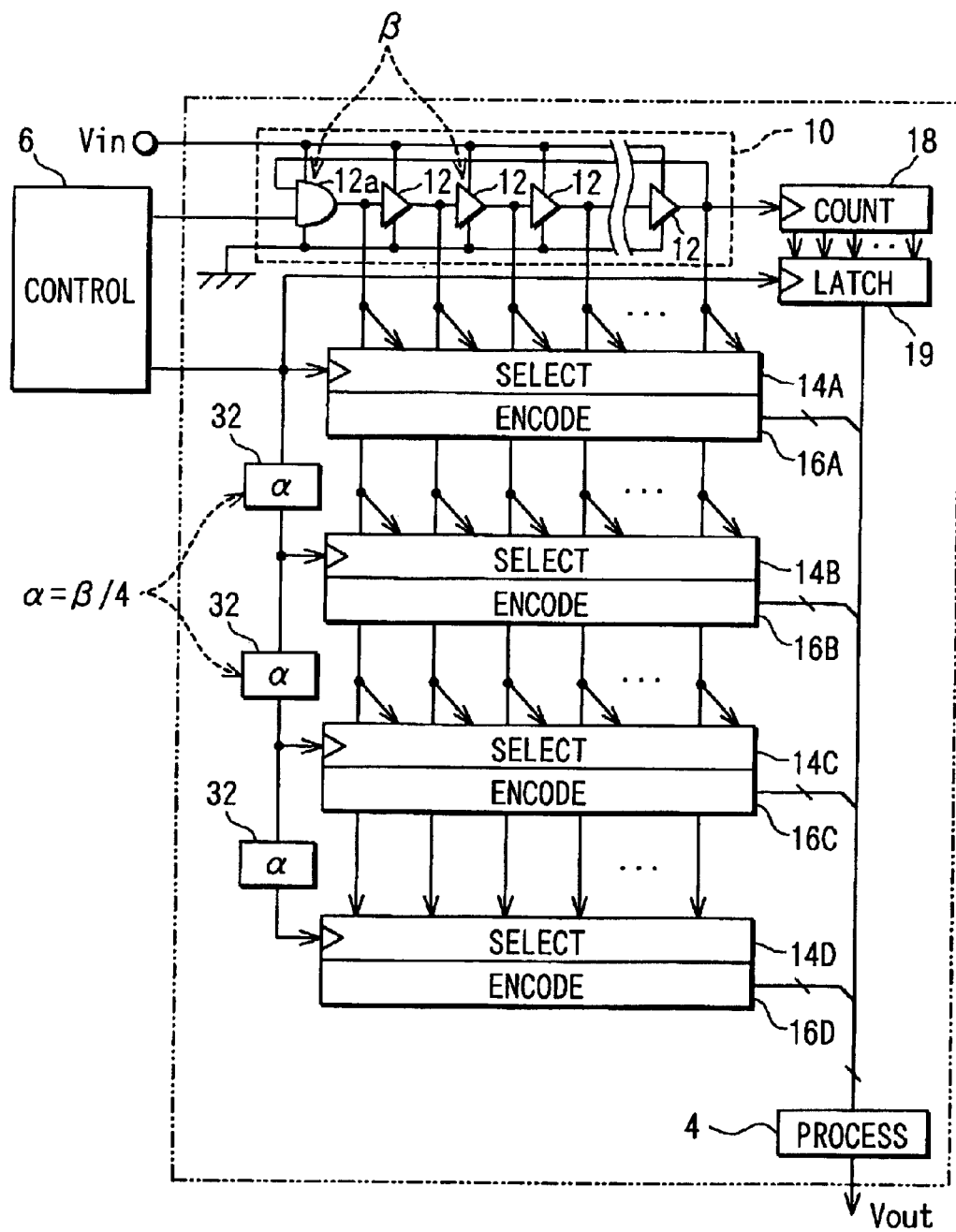
FIG. 16 is a circuit block diagram illustrating an A/D conversion apparatus according to a ninth embodiment of the present invention.

Next, FIG. 16 illustrates the construction of the A/D conversion apparatus according to a ninth embodiment. The A/D conversion apparatus of this embodiment is similar to the A/D conversion apparatus of the sixth embodiment shown in FIG. 13, and further has delay elements 32 provided on the paths for successively transmitting the instruction signals input to the pulse selector 14A from the control circuit 6 to the pulse selector 14B, pulse selector 14C and pulse selector 14D instead of providing the delay elements 32 on the paths leading from the ring delay line 10 to the pulse selectors 14A to 14D of the A/D conversion units 2A to 2D.

This makes it possible to shift the phase of instruction signals input to the pulse selectors 14A to 14D from the control circuit 6 and, hence, to improve the precision of A/D conversion like the A/D conversion apparatus of the fifth embodiment or the sixth embodiment.

Though the invention was described above by way of various embodiments, it should be noted that the embodiments can be modified in a variety of ways.

For instance, in the above embodiments (specifically, fifth, sixth and seventh embodiments), as shown in FIG. 12, the delay elements 32 having a delay time a are employed so that the digital value output as the A/D-converted result Vout from the signal processing circuit 4 varies in proportion to the input voltage (voltage of the analog signal Vin) (to realize the A/D conversion of high precision). When the delay time of the delay elements 32 (wiring delay) varies, however, there may be formed, for example, sixteen A/D conversion units A to S in advance as the A/D conversion units, and the number of the A/D conversion units used for the A/D conversion may be set among the 16 A/D conversion units in a manner that a change in the output from the encoders A to S enters within the delay time of a delay element forming the delay line (FIG. 17).

Figure 17:
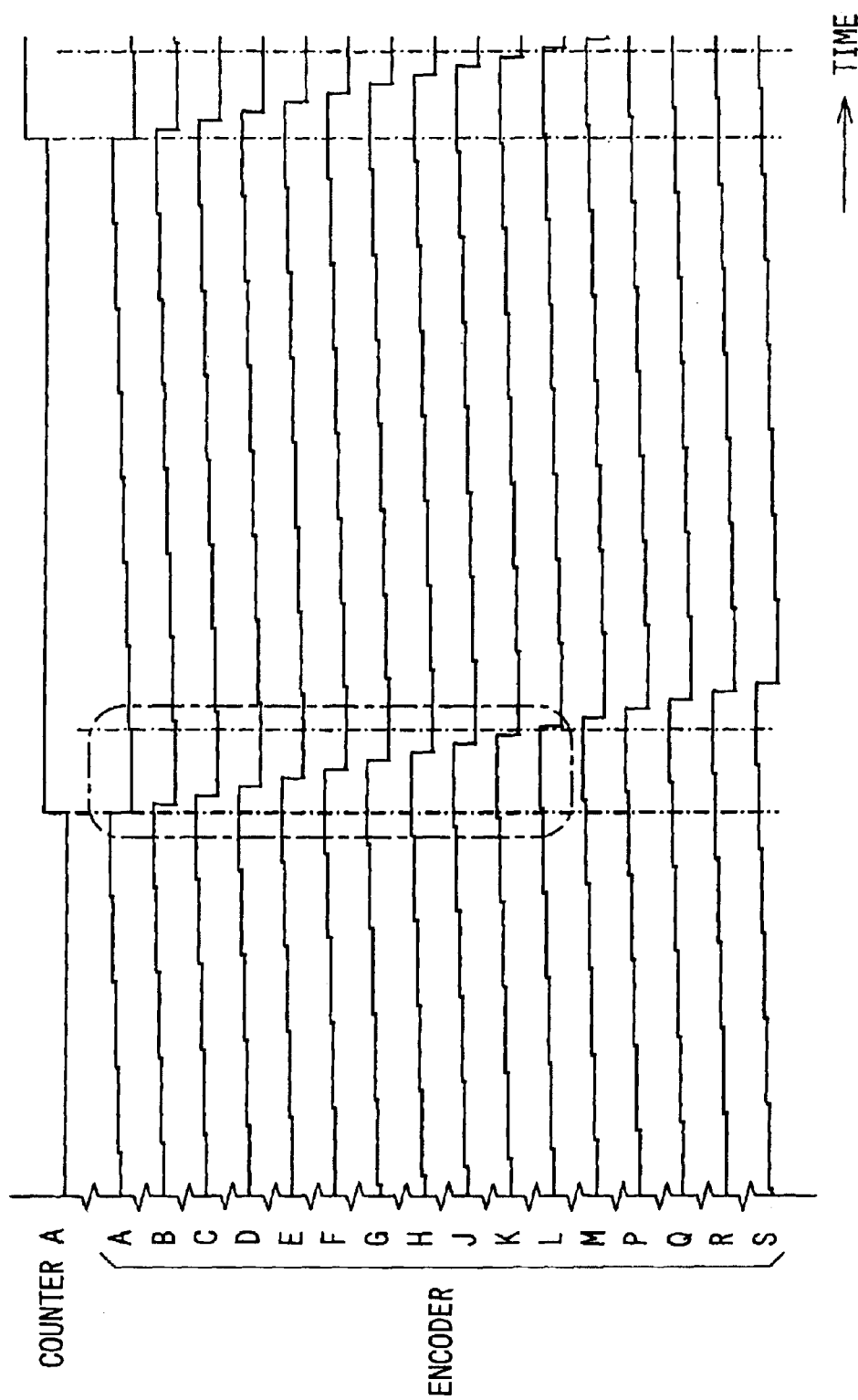
FIG. 17 is a signal diagram illustrating the procedure for setting the number of A/D conversion units that are used for maintaining the precision of A/D conversion.

More specifically, in the case of FIG. 17, the outputs from the encoders L to S are delayed by one count or more of the delay element by the encoder A. Therefore, ten A/D conversion units corresponding to the encoders A to K may be used for the A/D conversion of the analog signal Vin.

What is claimed is:

1. An A/D conversion apparatus for converting an analog signal into an n-bit digital value, comprising:

a plurality of A/D conversion means for converting an analog voltage into m-bit digital values;

control means for causing the plurality of A/D conversion means to perform A/D conversion operation at the same time point; and calculation means for adding up together or averaging the digital values obtained through the A/D conversion operation of the A/D conversion means thereby to calculate an n-bit digital value having the number of bits larger than that of the digital values obtained through the A/D conversion means;

wherein each of the A/D conversion means includes a delay line in which are successively connected a plurality of delay elements having delay times that vary depending upon the analog signal fed as a power-source voltage, and detecting means for detecting the number of delay elements through which a pulse signal has passed in the delay line and for producing a detected result as the m-bit digital value; and wherein the control means inputs the pulse signal to the delay lines of the A/D conversion means simultaneously so as to transmit through the delay lines, and operates the detecting means until the predetermined period of time elapses, so that the digital value is output from the detecting means at a time point at which the predetermined period of time elapses.

2. An A/D conversion apparatus according to claim 1, wherein at least one of the delay lines includes a ring delay line formed by connecting a plurality of delay elements like a ring; and the detecting means detects the number of delay elements through which the pulse signal has passed within the predetermined period of time from the number of times the pulse signal has circulated in the ring delay line and from a position which the pulse signal reached in the ring delay line.

3. An A/D conversion apparatus comprising:

integration-type first A/D conversion means which converts an analog voltage into an m-bit digital value consisting of mb bits of a most significant side and a ma-bit of a least significant side, which m being defined as m=mb+ma;

integration-type second A/D conversion means which converts the analog voltage into an ma-bit digital value;

control means for causing the A/D conversion means to perform A/D conversion operations at the same time point; and calculation means for adding up or averaging the ma-bit of the m-bit digital value output from the first A/D conversion means and the ma-bit digital value output from the second A/D conversion means to calculate a mc-bit digital value having the number of bits larger than that of the ma-bit digital value, thereby to output an n-bit digital value with the mc-bit digital value calculated by the calculation means as the least significant side and with the most significant side mb-bit of the m-bit digital value output from the first A/D conversion means as the most significant side, with n being defined as n=mb+mc.

4. An A/D conversion apparatus comprising:

a first delay line constructed by connecting, like a ring, a plurality of delay elements having a delay time that varies depending upon an analog signal that is fed as a power-source voltage, and permits a circulation of a pulse signal input to a starter delay element which is one of the plurality of delay elements;

count means for counting the number of times the pulse signal has circulated through the first delay line, and for outputting a counted result as a mb-bit digital value;

first position detecting means for detecting a position of the delay element reached by the pulse signal in the first delay line with the starter delay element as a reference, and for outputting a detected result as an ma-bit digital value;

at least one second delay line constructed by successively connecting the same plurality of delay elements as those of the first delay line, for receiving the pulse signal from the delay element of a final stage that returns the pulse signal that has circulated through the first delay line back to the starter delay element, and for transmitting the pulse signal successively from the delay element of the first stage;

at least one second position detecting means for detecting a position of the delay element reached by the pulse signal in the second delay line with the delay element of the first stage as a reference, and for outputting a detected result as an ma-bit digital value;

control means for inputting a starter pulse signal to the starter delay element in the first delay line, starting a count means, operating the first and second position detecting means at a time point when a predetermined first time has passed to produce an ma-bit digital value that represents the position reached by the pulse signal in the delay lines, and to produce from the count means a mb-bit digital value which is a counted result; and calculation means for calculating a mc-bit digital value having the number of bits larger than that of the ma-bit digital value by adding up together or averaging the ma-bit digital values output from the first and second position detecting means, thereby to output an n-bit digital value with the mc-bit digital value calculated by the calculation means as its least significant side and with a most significant mb-bit of an m-bit digital value output from an A/D converter as its most significant side, with n being defined as n=mb+mc.

5. An A/D conversion apparatus according to claim 4, wherein first delay means is provided in a path for transmitting the pulse signal from the delay element of the final stage in the first delay line to the delay element of the first stage in the second delay line, in order to delay the pulse signal by a predetermined period of time shorter than the delay time of the delay elements forming the delay lines.

6. An A/D conversion apparatus according to claim 5, wherein the second delay lines and the second position detecting means are provided in a plural number; and
wherein first delay means are provided in the paths for transmitting the pulse signal from the delay element of the first delay line to the delay elements of the first stage of the second delay lines, the first delay means having delay times which are so set that the time points for inputting the pulse signals to the second delay lines are deviated from each other.

7. An A/D conversion apparatus comprising:
a delay line constructed by connecting, like a ring, a plurality of delay elements having a delay time that varies depending upon an analog signal that is fed as a power-source voltage, and permits a circulation of a pulse signal input to a starter delay element which is one of the plurality of delay elements;
count means for counting the number of times the pulse signal has circulated through the delay line, and for outputting a counted result as a mb-bit digital value;
a plurality of position detecting means for detecting a position of the delay element reached by the pulse signal in the delay line with a starter delay element as a reference, and for outputting a detected result as an ma-bit digital value;
control means for inputting a starter pulse signal to the starter delay element in the delay line, starting the count means, operating the position detecting means at a time point when a predetermined first time has passed to produce a ma-bit digital value that represents a position reached by the pulse signal in the delay line, and to produce from the count means a mb-bit digital value which is the counted result; and
calculation means for calculating a mc-bit digital value having the number of bits larger than that of the ma-bit digital value by adding up together or averaging the ma-bit digital values output from the position detecting means, thereby to output an n-bit digital value with the mc-bit digital value calculated by the calculation means as its least significant side and with a most significant mb-bit of the m-bit digital value output from an A/D convener as its most significant side, with n being defined as n=mb+mc.

8. An A/D conversion apparatus according to claim 7, further comprising:
delay means, provided in a path for transmitting the pulse signal from the delay element of the delay line to the position detecting means, for differentiating the time points of inputting the pulse signals to the position detecting means from each other so that the position reached by the pulse signal in the delay line is detected.

9. An A/D conversion apparatus according to claim 7, further comprising:
delay means for differentiating the time point for inputting a position detection instruction to the position detecting means from each other within a time shorter than the delay time of the delay element forming the delay lines, the position detection instructions being output from the control means to operate the position detecting means at a time point when the first time has passed.

10. An A/D conversion apparatus for converting an analog signal into an n-bit digital value, comprising:
a plurality of A/D conversion means for converting an analog voltage into m-bit digital values;
control means for causing the A/D conversion means to perform A/D conversion operation; and
calculation means for adding up together or averaging the digital values obtained through the A/D conversion operation of the A/D conversion means thereby to calculate an n-bit digital value having the number of bits larger than that of the digital values obtained through the A/D conversion means;
wherein each of the A/D conversion means includes a delay line in which are successively connected a plurality of delay elements having delay times that vary depending upon the analog signal fed as a power-source voltage, and detecting means for detecting the number of delay elements through which a pulse signal has passed in the delay line and for producing a detected result as the m-bit digital value; and
wherein the control means inputs the pulse signal to the delay lines of the A/D conversion means so as to transmit through the delay lines, and operates the detecting means until the predetermined period of time elapses, so that the digital value is output from the detecting means at a time point at which the predetermined period of time elapses.

11. A method comprising:
converting, using an integration-type first A/D converter, an analog voltage into an m-bit digital value consisting of mb bits of a most significant side and a ma-bit of a least significant side, which m being defined as m=mb+ma;
converting the analog voltage into an ma-bit digital value using an integration-type second A/D converter;
causing the A/D converters to perform A/D conversion operations at the same time point; and
adding up or averaging the ma-bit of the m-bit digital value output from the first A/D converter and the ma-bit digital value output from the second A/D converter to calculate a mc-bit digital value having the number of bits larger than that of the ma-bit digital value, thereby to output an n-bit digital value with the mc-bit digital value calculated as the least significant side and with the most significant side mb-bit of the m-bit digital value output from the first A/D converter as the most significant side, with n being defined as n=mb+mc.

12. A method comprising:
connecting, like a ring, a plurality of delay elements to construct a delay line, the plurality of delay elements having a delay time that varies depending upon an analog signal that is fed as a power-source voltage, and permits a circulation of a pulse signal input to a starter delay element which is one of the plurality of delay elements;
counting the number of times the pulse signal has circulated through the delay line, and outputting a counted result as a mb-bit digital value;
detecting, using a plurality of position detectors, a position of the delay element reached by the pulse signal in the delay line with a starter delay element as a reference, and outputting a detected result as an ma-bit digital value;

inputting a starter pulse signal to the starter delay element in the delay line, starting the counting, operating the position detectors at a time point when a predetermined first time has passed to produce a ma-bit digital value that represents a position reached by the pulse signal in the delay line, and producing from the counting a mb-bit digital value which is the counted result; and calculating a mc-bit digital value having the number of bits larger than that of the ma-bit digital value by adding up together or averaging the ma-bit digital values output from the position detectors, thereby to output an n-bit digital value with the mc-bit digital value calculated as its least significant side and with a most significant mb-bit of a m-bit digital value output from an A/D converter as its most significant side, with n being defined as n=mb+mc.

* * * * *